United States Patent
Kim et al.

(10) Patent No.: US 6,424,023 B1
(45) Date of Patent: Jul. 23, 2002

(54) LEADFRAME FOR MOLDED SEMICONDUCTOR PACKAGE AND SEMICONDUCTOR PACKAGE MADE USING THE LEADFRAME

(75) Inventors: Gi Jeong Kim, Kuri; Seung Mo Kim, Seoul; Jin An Lee, Kuri, all of (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/513,232

(22) Filed: Feb. 24, 2000

(30) Foreign Application Priority Data

Apr. 14, 1999 (KR) .............................. 99-13130

(51) Int. Cl.⁷ .............................. H01L 23/48
(52) U.S. Cl. .................. 257/666; 257/667; 257/670
(58) Field of Search ................. 257/667, 670, 257/675, 676; 255/666

(56) References Cited

U.S. PATENT DOCUMENTS

| | | | |
|---|---|---|---|
| 5,150,193 A | * 9/1992 | Yasuhara et al. | 357/70 |
| 5,233,222 A | * 8/1993 | Djennas et al. | 257/676 |
| 5,483,098 A | 1/1996 | Joiner, Jr. | 257/676 |
| 5,650,663 A | 7/1997 | Parthasarathi | 257/706 |
| 5,661,338 A | * 8/1997 | Yoo et al. | 657/676 |
| 5,723,899 A | 3/1998 | Shin | 257/666 |
| 5,780,772 A | 7/1998 | Singh et al. | 174/52.2 |
| 5,783,860 A | 7/1998 | Jeng et al. | 257/675 |
| 5,874,773 A | * 2/1999 | Terada et al. | 257/676 |
| 5,929,513 A | 7/1999 | Asano et al. | 257/675 |
| 6,093,960 A | 7/2000 | Tao et al. | 257/706 |
| 6,166,446 A | 12/2000 | Masaki | 257/796 |
| 6,215,177 B1 | * 4/2001 | Corisis et al. | 257/666 |

* cited by examiner

Primary Examiner—Jerome Jackson, Jr.
Assistant Examiner—Lourdes Cruz
(74) Attorney, Agent, or Firm—Skjerven Morrill LLP; James E. Parsons (57) ABSTRACT

A leadframe and molded semiconductor package made using the leadframe are disclosed. The leadframe includes leads extending from a dam bar toward a central chip mounting region. A pseudo tie bar extends diagonally from three of the four corners of the dam bar toward the chip mounting region. A resin introduction slot is at the remaining corner of the dam bar. The resin introduction slot is wider than a space between adjacent leads. The leads adjacent to the resin introduction slot increase in width as they extend from the dam bar toward the chip mounting region. The leadframe is used to form a semiconductor package having a package body formed of a molded resin. The leadframe design minimizes voids and damage caused by the molding process.

26 Claims, 11 Drawing Sheets

LEADFRAME FOR MOLDED SEMICONDUCTOR PACKAGE AND SEMICONDUCTOR PACKAGE MADE USING THE LEADFRAME

CROSS REFERENCE TO RELATED APPLICATION

This application is related to another commonly assigned application entitled "Nonexposed Heat Sink for Semiconductor Package," application No. 09/513,067, which was filed herewith on Feb. 24, 2000, and is incorporated herein by reference in its entirety.

FIELD OF THE INVENTION

The present invention relates to a lead frame used to make a semiconductor package. More particularly, the present invention relates to a lead frame capable of a superior resin filling profile in a molding process used to make the semiconductor package.

BACKGROUND OF THE INVENTION

Typically, lead frames for semiconductor packages are fabricated by processing a strip, made of copper (Cu), iron (Fe), aluminum (Al) or an alloy thereof, in accordance with a mechanical method such as a stamping method or a chemical method such as an etching method in such a fashion that it has a plurality of leads. Leads of such a lead frame serve as conductive lines for connecting a semiconductor chip mounted on the lead frame to external circuits. Such leads also serve as a support for holding a semiconductor package fabricated using the associated lead frame to a mother board. Lead frames formed on one strip are cut at their peripheral edges in a singulation process, so that they are separated from one another.

Figure 1A:
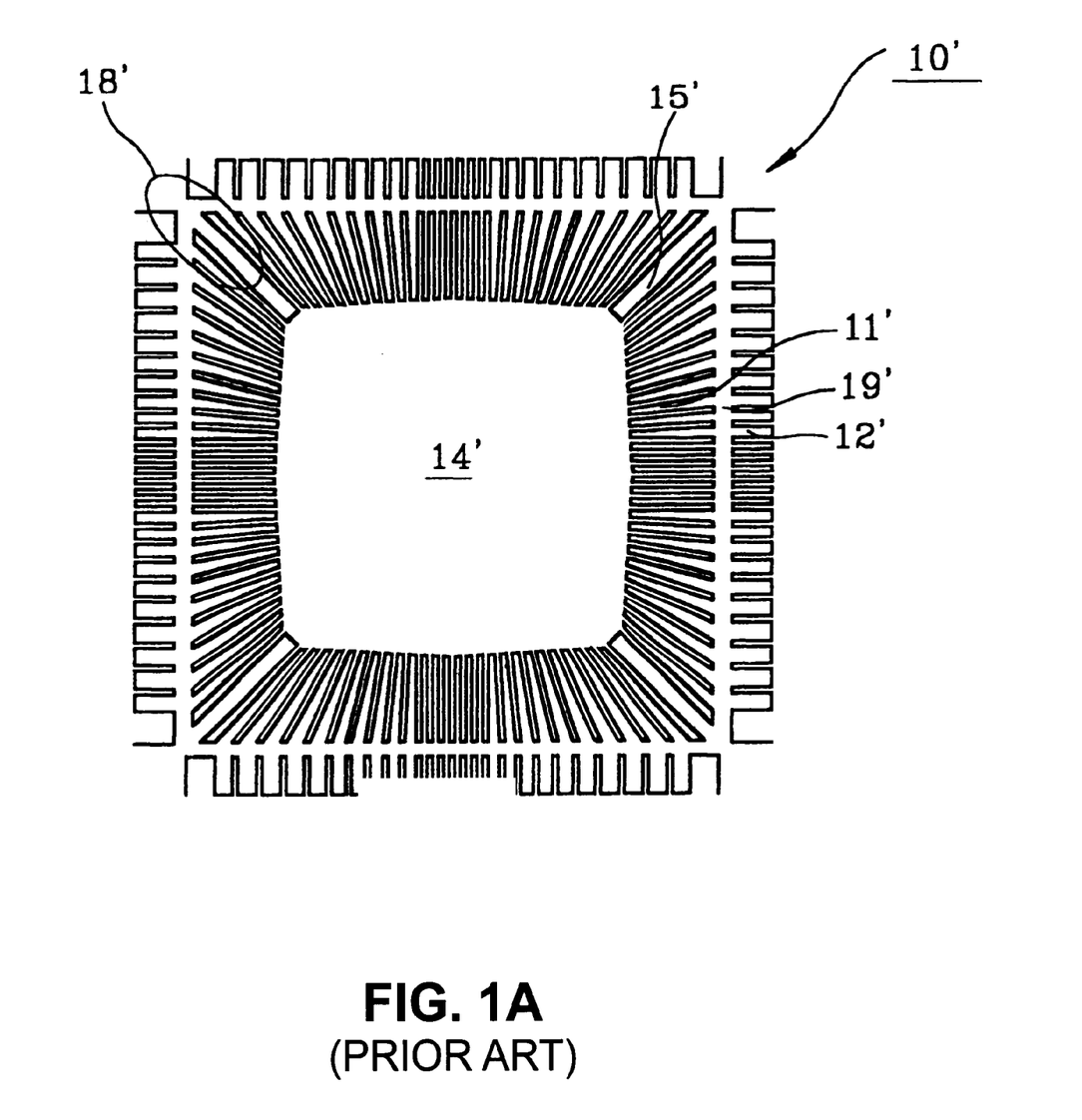
FIG. 1a is a plan view illustrating a typical structure of a conventional lead frame.

Referring to FIG. 1a, a typical structure of a conventional lead frame is illustrated. As shown in FIG. 1a, the lead frame, which is denoted by the reference numeral 10', has a structure including a central opening 14' having a substantially rectangular or square shape, and a plurality of leads extending radially around the central opening 14'. Each of the leads has an inner lead 11' adapted to be encapsulated by a resin encapsulate (denoted by the reference numeral 4 in FIG. 3) subsequently molded, and an outer lead 12' disposed beyond the resin encapsulate. Each lead is connected to a dam bar 19' at the outer end of its inner lead 11' and at the inner end of its outer lead 12' so that it is supported by the dam bar 19'. In addition to the support function for the leads, the dam bar 19' has a function for preventing melted encapsulating resin from being outwardly leaked between adjacent inner leads 11' during a molding process.

Adjacent ones of the inner leads 11' of the lead frame have a space defined therebetween in such a fashion that it increases gradually in width as it extends from the opening 14' to the dam bar 19'. Also, all spaces defined for all inner leads 11' have the same width at the same radial position. In other words, all spaces of all inner leads 11' have the same size and shape.

Pseudo tie bars 15' are arranged at four corners of the lead frame 10', respectively. Each pseudo tie bar 15' extends diagonally while having a width larger than a typical width of the leads. Where a semiconductor chip mounting plate (not shown) is to be arranged within the central opening 14', the pseudo tie bars 15' serve as tie bars for supporting the semiconductor chip mounting plate by use of an adhesion means such as an adhesive tape. Otherwise, the pseudo tie bars 15' may be removed to simply leave spaces, respectively. In some cases, they may be used as inner leads or ground leads.

In FIG. 1, the reference numeral 18' denotes an initial encapsulating resin introduction region defined at a selected one of the pseudo tie bars 15' respectively arranged at the four corners of the lead frame 10' in order to allow melted encapsulating resin of high temperature and high pressure to be introduced into a molding region.

As apparent from the above description, the conventional lead frame 10' has a symmetrical structure in longitudinal, lateral, and diagonal directions.

Figure 1B:
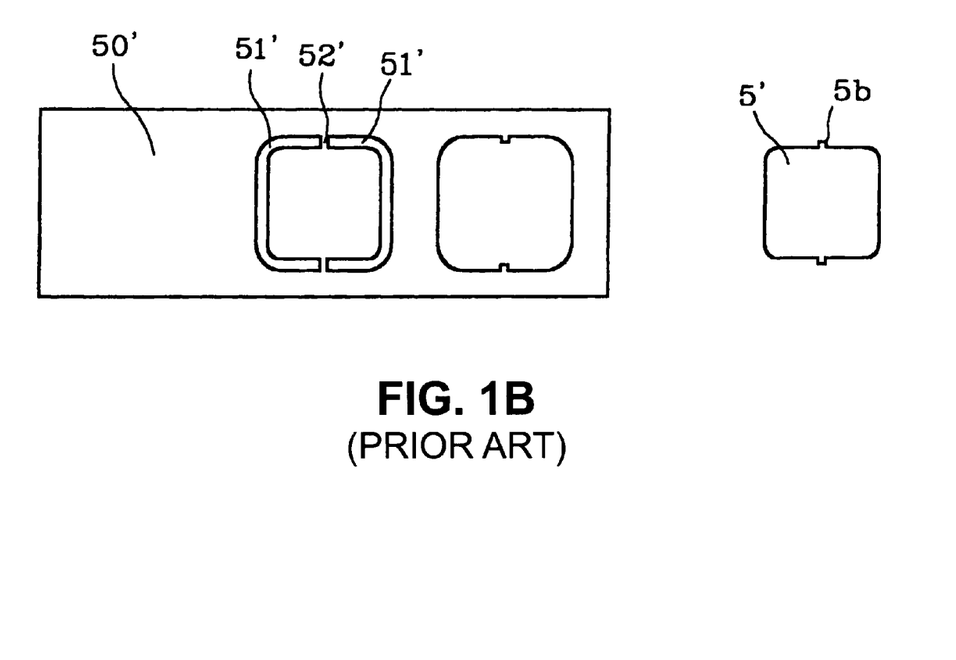
FIG. 1b is a plan view illustrating a procedure for fabricating a conventional heat sink.

On the other hand, FIG. 1b is a schematic view illustrating a procedure for fabricating a conventional heat sink. As shown in FIG. 1b, a pair of facing U-shaped slots 51' are formed through a metal strip 50' in accordance with a stamping process in such a fashion that a pair of facing support bars 52' are left therebetween. The support bars 52' have a reduced thickness as compared to that of the metal strip 50' because the metal material of the metal strip 50' is subjected to an elongation at regions corresponding to those support bars 52' during the stamping process. The reason why the support bars 52' are formed is because when a heat sink, which is denoted by the reference numeral 5', is completely cut from the metal strip 50' using a single stamping step, there is a high possibility for the heat sink 5' to be bent due to a relatively large thickness (typically, about 1.65 mm) of the metal strip 50'. In order to planarize bent heat sinks, it is necessary to use an additional process. After the stamping process, the heat sink 5' is still held to the metal strip 50' while being supported by the support bars 52' between the slots 51'. In this state, the support bars 52' are cut, so that the heat sink 5' is separated from the metal strip 50'. The resultant heat sink 5' has a substantially square structure provided with two protrusions 5b'. The support bars 52' are cut in accordance with upward and downward pressing operations respectively conducted by two pressing tools. Since the support bars 52' are relatively thick, the elongation of the metal thereof occurring during the pressing operations proceeds in directions slightly inclined along an associated one of the support bars 52' from upward and downward directions, respectively. As a result, each protrusion 5b' has a V-shaped cross-section at each side wall thereof.

Typically, the cut heat sink 5' is subsequently coated with nickel (Ni) in order to prevent its surface, exposed in a state integrated into a resin encapsulate, from being oxidized in air. The nickel-coated surface of the heat sink 5' is also subjected to a sand blast process for an easy marking thereof. The heat sink 5' is also subjected to a well-known black oxidation process (adapted to form a CuO thin film and/or a $Cu_2O$ thin film) at its surface, on which a semiconductor chip is mounted, and its surface contacting the resin encapsulate, in order to obtain an improved bonding force to the resin encapsulate at those surfaces.

Figure 2:
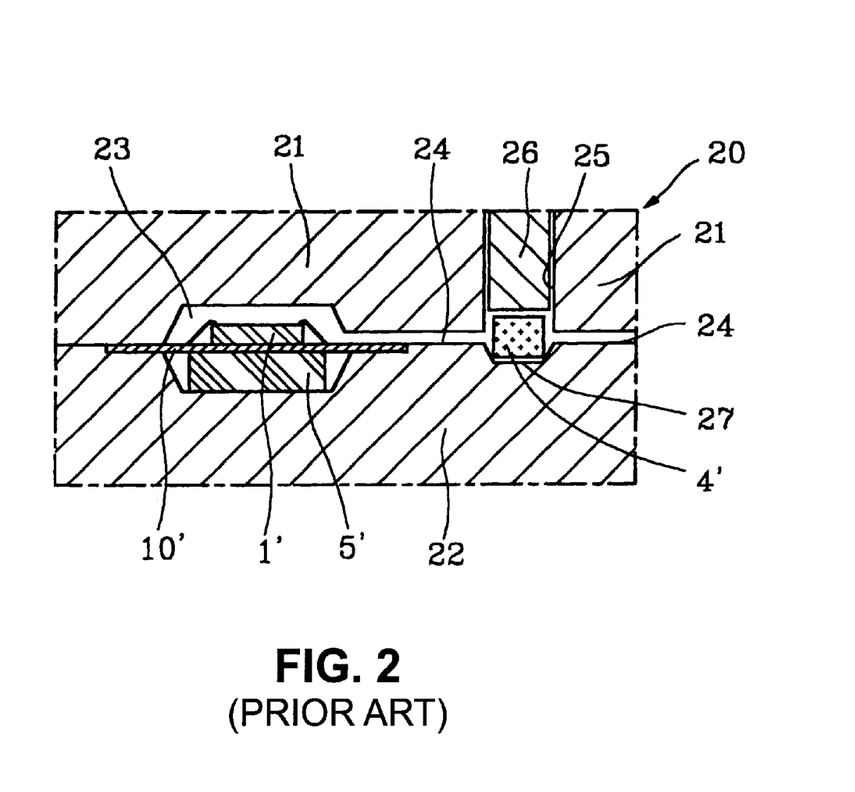
FIG. 2 is a cross-sectional view illustrating a typical mold used in a molding process for the fabrication of semiconductor packages.

FIG. 2 is a cross-sectional view illustrating a typical mold used in a molding process for the fabrication of semiconductor packages. As shown in FIG. 2, the mold, which is denoted by the reference numeral 20, includes an upper mold 21 and a lower mold 22. Typically, the lead frame 10' attached at its lower surface with the heat sink 5' and at its upper surface with a semiconductor chip 1' is laid on the lower mold 22 which is, in turn, coupled to the upper mold 21 in such a fashion that the lead frame 10' is received in a mold cavity 23 defined by the upper and lower molds 21 and 22. A pressurized melted encapsulating resin 4' is injected into the mold cavity 23 via a mold runner 24 by a resin feeding ram 26 arranged at a pouring gate 25 of the mold 20. The mold runner 24 is formed on the lower surface of the upper mold 21 in such a fashion that it communicates with the mold cavity 23 while communicating with a port 27. The melted encapsulating resin of high temperature and high pressure is set as it is cooled, thereby forming a resin encapsulate (denoted by the reference numeral 4 in FIG. 3).

Figure 3:
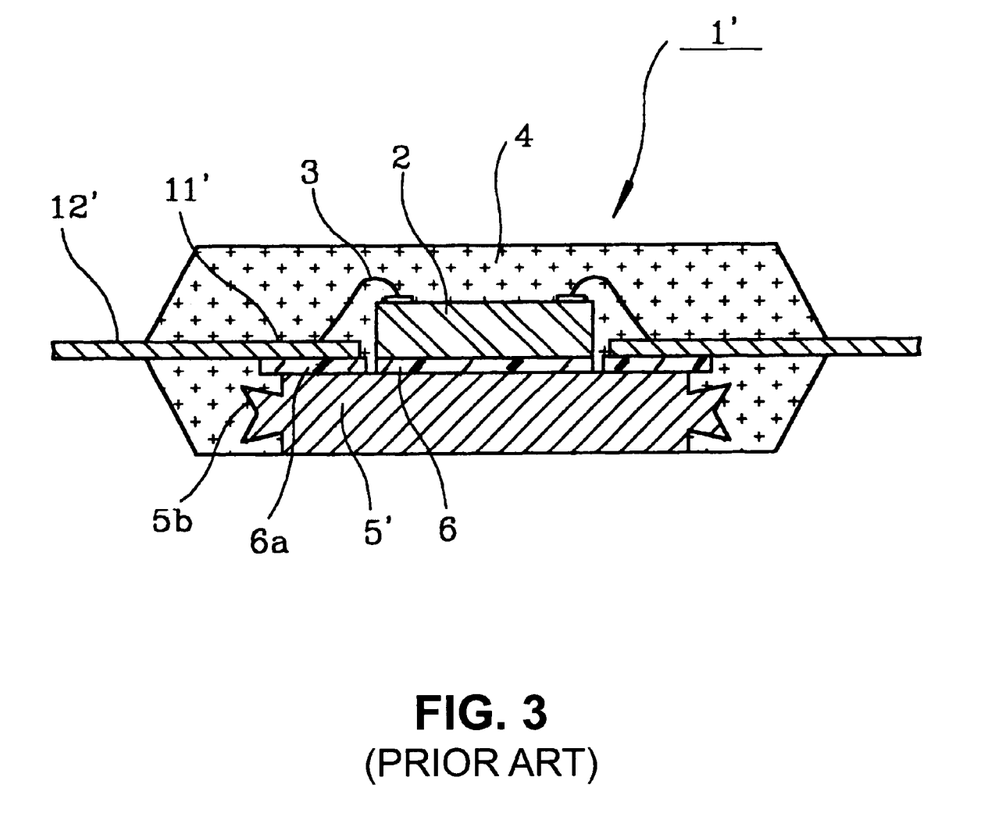
FIG. 3 is a cross-sectional view illustrating a typical structure of a conventional semiconductor package fabricated using the conventional lead frame of FIG. 1a and the conventional heat sink of FIG. 1b.

FIG. 3 is a cross-sectional view illustrating a typical structure of a conventional semiconductor package fabricated using a lead frame such as the conventional lead frame 10' of FIG. 1a and a heat sink such as the conventional heat sink 5' of FIG. 1b. In FIG. 3, elements respectively corresponding to those in FIGS. 1a and 1b are denoted by the same reference numerals. As shown in FIG. 3, the semiconductor package, which is denoted by the reference numeral 1', includes a heat sink 5' having a relatively large thickness, and a plurality of leads each having an inner lead 11' and an outer lead 12'. The leads are attached to the outer peripheral portion of the upper surface of the heat sink 5' by means of adhesive tapes 6a. A semiconductor chip 2 integrated with a variety of circuits is centrally mounted on the heat sink 5' by means of an adhesive layer 6. The semiconductor package 1' also includes a plurality of conductive wires 3 each connecting each inner lead 11' to the semiconductor chip 2, and a resin encapsulate 4 for protecting the semiconductor chip 2, inner leads 11' and conductive wires 3 from the external environment. The heat sink 5' is exposed at its surface arranged at the lower surface side of the resin encapsulate 4 in order to obtain improved heat discharge characteristics. The heat sink 5' is provided with two protrusions 5b' formed in a pressing process for the heat sink 5', as mentioned above.

In the case of a semiconductor package fabricated using a conventional lead frame having both a semiconductor chip mounting plate and a heat sink, although not shown, a semiconductor chip is mounted on the semiconductor chip mounting plate by means of an adhesive layer. In the fabrication of such a semiconductor package, the lead frame attached with the semiconductor chip is loaded in a mold in a state in which the heat sink has been loaded in the cavity of a lower mold included in the mold. Subsequently, a melted encapsulating resin of high temperature and high pressure is injected into the cavity of the mold, and then set. That is, the lead frame structure and molding method used in the fabrication of this semiconductor package are the same as the lead frame structure using no semiconductor chip mounting plate and the molding method associated therewith, except that the heat sink is attached to the lower surface of the semiconductor chip mounting plate using the pressure and bonding force of the encapsulating resin.

In the above mentioned conventional lead frame 10', however, the space defined between adjacent ones of the inner leads 11' arranged at the initial encapsulating resin introduction region 18' is the same as that of the inner leads 11' arranged at regions other than the initial encapsulating resin introduction region 18'. For this reason, the filling profile of the melted encapsulating resin injected into the mold cavity through the initial encapsulating resin introduction region 18' is degraded. That is, although the initial encapsulating resin introduction region 18' defined at one corner of the lead frame 10' is subjected to a higher pressure than those applied to regions, namely, air vent regions (denoted by no reference numeral), defined at the remaining three corners of the lead frame 10', the space defined between adjacent inner leads 11' is uniform at all regions, so that it is impossible to obtain a smooth flow of melted encapsulating resin. As a result, a turbulent flow of melted encapsulating resin is generated, thereby causing voids to be formed in the molded resin encapsulate 4 and/or at the interface between the molded resin encapsulate 4 and mold cavity 23. Consequently, there is a high possibility of a degradation in the performance characteristics and appearance of the final product.

It is also difficult to cut the conventional heat sink 5' of FIG. 1b used in the fabrication of the conventional semiconductor package 1' by use of a single stamping step because the heat sink 5' has a large thickness of 1 to 3 mm. For this reason, several stamping steps are required for the cutting of the heat sink 5'. This results in a complexity of the entire process. The entire process becomes more complex because the heat sink 5' is coated with nickel (Ni) in order to prevent its surface, exposed in a state integrated to a resin encapsulate, from being oxidized in air, and then subjected to a sand blast process for an easy marking thereof while being subjected to a well-known black oxidation process at its surface, on which a semiconductor chip is mounted, and its surface contacting the resin encapsulate, in order to obtain an improved bonding force to the resin encapsulate at those surfaces. In addition, the protrusions 5b left after the cutting of the heat sink 5' serve to render the turbulent flow generated in a resin filling process to be severe, thereby increasing the possibility of the formation of voids. As a result, the quality of the molded resin encapsulate 4 is degraded.

In the fabrication of the conventional semiconductor package 1' using the conventional lead frame 10' of FIG. 1a and the conventional heat sink 5' of FIG. 1b, additional problems are also involved. For example, the leads of the lead frame 10' may be downwardly bent due to the weight of the heat sink 5' during the feeding of the lead frame 10' to a subsequent process in a state in which each inner lead 11' is bonded to the peripheral portion of the upper surface of the heat sink 5'. This is because the heat sink 5' has a thickness considerably larger than that of each lead 11'. Due to such a deformation of the leads 11', a short circuit may be generated between adjacent ones of the leads 11'. Also, the quality of the wire bonding formed between the semiconductor chip 1 and each lead 11' may be degraded.

In the conventional semiconductor package structure, the heat sink 5' is flush with the lower surface of the resin encapsulate 4 at its lower surface in order to obtain an improved heat discharge effect. For such a structure, it is necessary to use a more sophisticated mold structure. That is, it is necessary to use a mold capable of allowing the heat sink 5' to be accurately flush with the lower surface of the cavity of the lower mold 22 at its lower surface. Moreover, it is impossible to completely eliminate a flashing phenomenon of the melted encapsulating resin between the lower surface of the heat sink 5' and the lower surface of the cavity of the lower mold 22 because the injection of the melted encapsulating resin is conducted at a high temperature and a high pressure. For this reason, it is necessary to use a deflashing process for removing a set resin thin film left on the exposed lower surface of the heat sink 5'.

SUMMARY OF THE INVENTION

Therefore, a primary object of the invention is to provide a lead frame capable of exhibiting a superior resin filling profile, thereby avoiding formation of voids in a molding process.

A secondary object of the invention is to provide a semiconductor package fabricated using a heat sink, which is adapted to a lead frame structured to accomplish the primary object of the invention and has a structure capable of achieving an easy fabrication thereof, effectively suppressing a bending phenomenon of leads of the lead frame, and minimizing generation of a turbulent flow of melted encapsulating resin in a molding process.

In accordance with one aspect, the present invention provides a lead frame comprising: a plurality of spaced inner leads extending outwardly in a radial direction around an opened central chip mounting region, the inner leads having outer ends integrally supported by a dam bar having four corners, inside the dam bar, respectively; a plurality of outer leads each having an inner end supported by the dam bar outside the dam bar and an outer end supported by a frame; pseudo tie bars extending diagonally from three of the four corners of the dam bar toward the central chip mounting region, respectively; an initial encapsulating resin introduction region defined by at least two of the inner leads arranged adjacent to the remaining one of the four corners of the dam bar, where any one of the pseudo tie bars does not exist, the initial encapsulating region having an encapsulating resin introduction slot having a width larger than that of a space defined between adjacent ones of the remaining inner leads; air vent regions respectively defined at the three corners of the dam bar where the pseudo tie bars are arranged, each of the air vent regions including an associated one of the pseudo tie bars, and at least two of the inner leads arranged adjacent to the associated pseudo tie bars; and at least the inner leads arranged at the initial encapsulating resin introduction region having a width increasing gradually as they extend from a region adjacent to the dam bar to a region adjacent to the central chip mounting region in such a fashion that a space defined between adjacent ones of the inner leads arranged at the initial encapsulating resin introduction region has a gradually reduced width.

In accordance with another aspect, the present invention provides a semiconductor package comprising: semiconductor chip; a heat sink having an upper surface, on which the semiconductor chip is centrally mounted by an adhesive layer interposed between the semiconductor chip and the heat sink; a lead frame having a plurality of radially-extending leads each being bonded to a peripheral edge of the heat sink by the adhesive layer and electrically connected to the semiconductor chip by a wire, the lead frame also having an encapsulating resin introduction region and air vent regions, each of the regions overlapping with a part of the leads; a resin encapsulate completely encapsulating the semiconductor chip, the wires, and the heat sink while encapsulating the initial encapsulating resin introduction region and the air vent regions, and the inner leads; and at least two of the inner leads arranged at the initial encapsulating resin introduction region having a width increasing gradually as they extend from a region adjacent to a peripheral edge of the resin encapsulate to a region adjacent to the semiconductor chip in such a fashion that a space defined therebetween has a width gradually reduced, but larger than that of a space defined between adjacent ones of the inner leads arranged regions other than the initial encapsulating resin introduction region.

BRIEF DESCRIPTION OF THE DRAWINGS

Other objects and aspects of the invention will become apparent from the following description of embodiments with reference to the accompanying drawings in which:

FIG. 4b is a schematic plan view illustrating a state in which a heat sink is attached to the lead frame of FIG. 4a;

FIG. 8b is a side view of the heat sink shown in FIG. 8a;

DESCRIPTION OF THE PREFERRED EMBODIMENTS

This application claims priority from a Korean patent application, no. 99-13130, which was filed on Apr. 13, 1999 and is incorporated herein by reference.

Figure 4A:
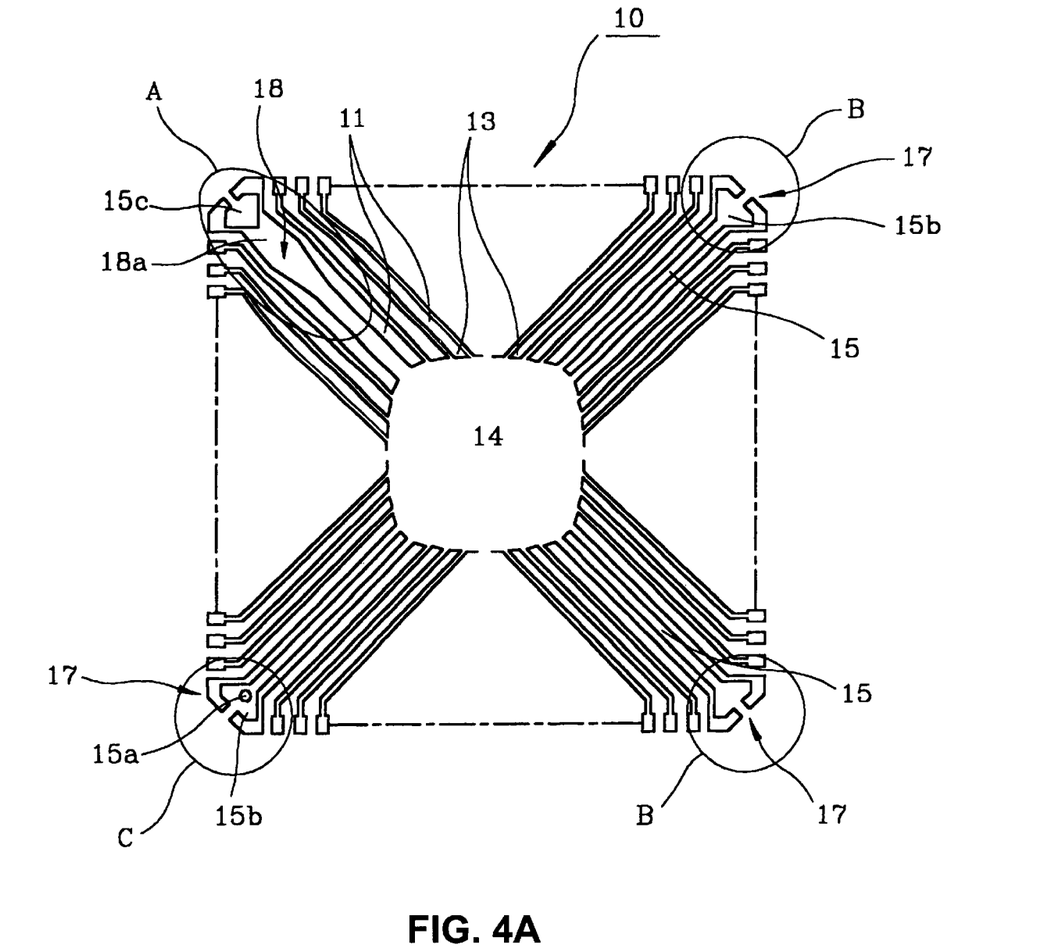
FIG. 4a is a schematic plan view illustrating a lead frame according to an embodiment of the present invention.
Figure 4B:
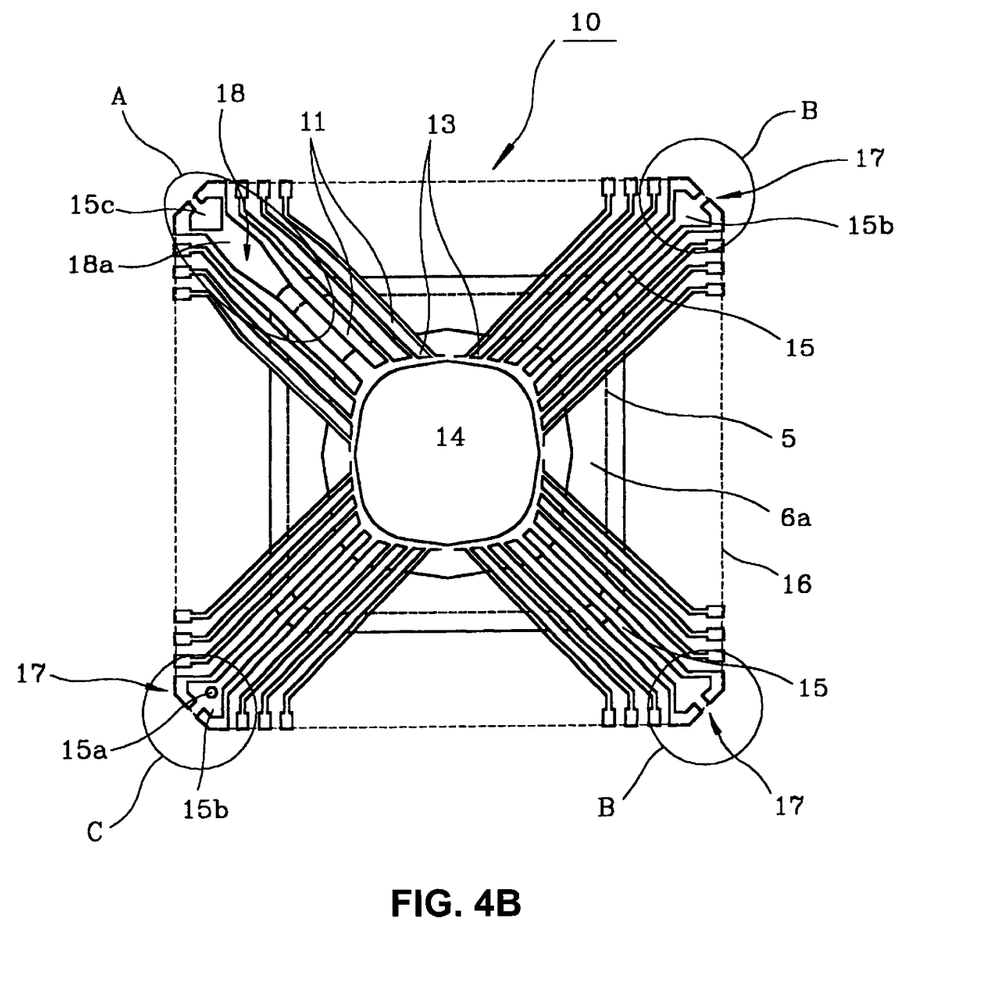

FIG. 4a is a schematic plan view illustrating a lead frame according to an embodiment of the present invention. In FIG. 4a, the lead frame is denoted by the reference numeral 10. FIG. 4b is a schematic plan view illustrating a state in which a heat sink 5 is attached to the lead frame 10 of FIG. 4a by means of an adhesive layer 6a such as a double-sided adhesive tape. The adhesive layer 6a is formed on the lower surface of the lead frame 10. The adhesive layer 6a has a central large opening vertically aligned with a central opening of the lead frame 10. Accordingly, the heat sink 5 is upwardly exposed at its central portion on which a semiconductor chip (not shown) is mounted.

For the convenience of description, the following description will be made while simultaneously referring to both FIGS. 4a and 4b.

The lead frame 10 includes a central opening 14 having a relatively rectangular or square shape, and a plurality of leads extending radially around the central opening 14 while being uniformly spaced from one another. Each lead has an inner lead 11 and an outer lead (denoted by the reference numeral 12 in FIG. 7). The inner lead 11 of each lead is supported by an inner edge of a dam bar (denoted by the reference numeral 19 in FIGS. 6 and 7) at its outer end. The outer lead 12 of each lead is supported by an outer edge of the dam bar at its inner end. The outer end of the outer lead 12 is connected to a frame (not shown) in such a fashion that it is integral with the frame. In addition to the function for supporting the inner and outer leads 11 and 12, the dam bar has a function for preventing melted encapsulating resin from being outwardly leaked between adjacent inner leads 11 during a molding process. The reference numeral 18 denotes an initial encapsulating introduction region defined at one corner of the lead frame 10. At the initial encapsulating introduction region 18, melted encapsulating resin injected through a mold runner (denoted by the reference numeral 24 in FIG. 2) is introduced into a mold cavity (denoted by the reference numeral 23 in FIG. 2) to form a resin encapsulate (denoted by the reference numeral 4 in FIG. 10). The reference numeral 17 denotes air vent regions defined at the remaining corners of the lead frame 10. The air vent regions 17 are adapted to outwardly vent air from the mold cavity when the encapsulating resin is introduced into the mold cavity.

For the simplicity of illustration, the dam bar and outer leads are not shown in FIGS. 4a and 4b. In FIGS. 4a and 4b, the reference numeral 13 denotes a silver-plated region defined at the inner end of each inner lead 11. The silver-plated region is adapted to increase a bonding force subsequently generated in a wire bonding process to electrically connect the associated inner lead 11 to a semiconductor chip.

The lead frame 10 also includes pseudo tie bars 15 respectively arranged at the air vent regions 17 in such a fashion that they extend diagonally toward the central opening 14. No pseudo tie bar is arranged at the initial encapsulating resin introduction region 18. Instead, an encapsulating resin introduction slot 18a having a large width is formed at the initial encapsulating resin introduction region 18 in order to allow an easy introduction of encapsulating resin into the mold cavity.

Figure 5:
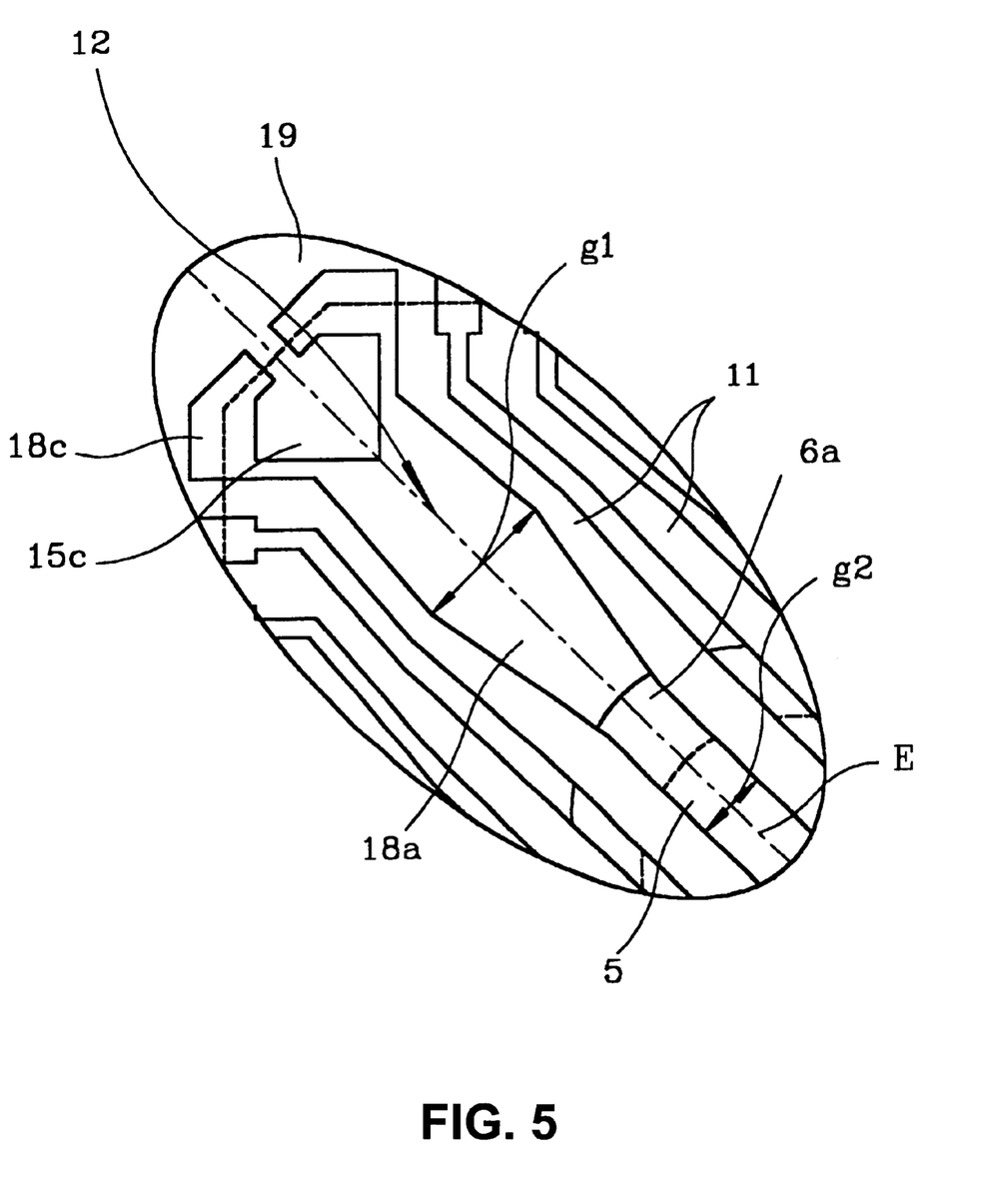
FIG. 5 is an enlarged plan view corresponding to a portion "A" of FIG. 4b.

FIG. 5 is an enlarged plan view corresponding to a portion "A" of FIG. 4b. As shown in FIG. 5, the slot 18a is defined between at least one pair of inner leads 11 respectively arranged at opposite sides of a phantom line E extending diagonally between one corner of a resin encapsulate forming region (denoted by the reference numeral 16 in FIG. 4b) and the central opening 14. The slot 18a has an enlarged slot portion arranged above a region where the adhesive layer or tape 6a and heat sink 5 attach to the lower surface of the inner leads 11, thereby allowing encapsulating resin to flow downwardly therethrough, and a reduced slot portion arranged within the region where the adhesive layer 6a and heat sink 5 attach to the lower surface of the inner leads 11, thereby preventing encapsulating resin from flowing downwardly therethrough. The enlarged slot portion of the slot 18a has a width g1, and the reduced slot portion of the slot 18a has a width g2. The width g1 is larger than the width g2, thereby allowing encapsulating resin to be introduced into the mold cavity through the enlarged slot portion of the slot 18a without forming a turbulent or vortex flow. Preferably, the width g1 is not more than 0.7 mm whereas the width g2 is not more than 0.35 mm while being more than the width of the space defined between adjacent inner leads 11. Where the width g2 is more than 0.35 mm, the area of the adhesive layer 6a exposed to melted encapsulating resin of a high temperature increases excessively, thereby causing the adhesive layer 6a to be melted by the melted encapsulating resin. In this case, the adhesive layer 6a may be perforated. Furthermore, voids may be formed in the molded resin encapsulate. On the other hand, where the width g2 is less than the width of the space defined between adjacent inner leads 11, it is difficult to expect a sufficient improvement in resin filling profile.

The lead frame 10 is also provided with an enlarged portion 15c at the outer end of the slot 18a (that is, a portion of the lead frame 10 arranged adjacent to a mold runner gate (denoted by the reference numeral 18b in FIG. 6) of the lead frame 10 at which the mold runner 24 of the mold 20 of FIG. 2 is arranged). The enlarged portion 15c of the lead frame 10 serves to smoothly guide the melted encapsulating resin introduced through the mold runner gate 18 toward the slot 18a. Alternatively, the lead frame 10 may have an additional slot 18c extending around the side portions and/or rear portion of the enlarged portion 15c in order to allow a smoother flow of the melted encapsulating resin. Accordingly, the melted encapsulating resin reaching the enlarged portion 15c of the lead frame 10 can be guided by the enlarged portion 15c to smoothly flow along the upper surface of the lead frame and then through the slots 18a and 18c in a downward direction, so that it is filled in the mold cavity.

The inner leads 11 arranged at the initial encapsulating resin introduction region 18 or the inner leads 11 arranged at all regions including the initial encapsulating resin introduction region 18 and the air vent regions 17 have a width increasing as they extend from their portions adjacent to the dam bar 19 toward the central opening 14, respectively. That is, the space defined between adjacent ones of those inner leads 11 has a gradually reduced width between the dam bar 19 and central opening 14. Where each of those inner leads 11 has an increased width at its portion adjacent to the central opening 14, there is an advantage in that an easy wire bonding of the inner leads 11 to a semiconductor chip can be achieved. It is also possible to prevent the inner leads 11 from being bent at their ends. Accordingly, it is possible to prevent adjacent ones of the inner leads 11 from being short-circuited at their ends. Similarly to the reduced slot portion of the slot 18a having the width g2, it is preferred that the space defined between the inner ends of adjacent inner leads 11 attached with the adhesive layer 6a be not less than 0.35 mm. Where this space is more than 0.35 mm, the area of the adhesive layer 6a exposed to melted encapsulating resin of a high temperature increases excessively, thereby causing the adhesive layer 6a to be melted by the melted encapsulating resin. In this case, the adhesive layer 6a may be perforated. Furthermore, voids may be formed in the molded resin encapsulate.

Figure 6:
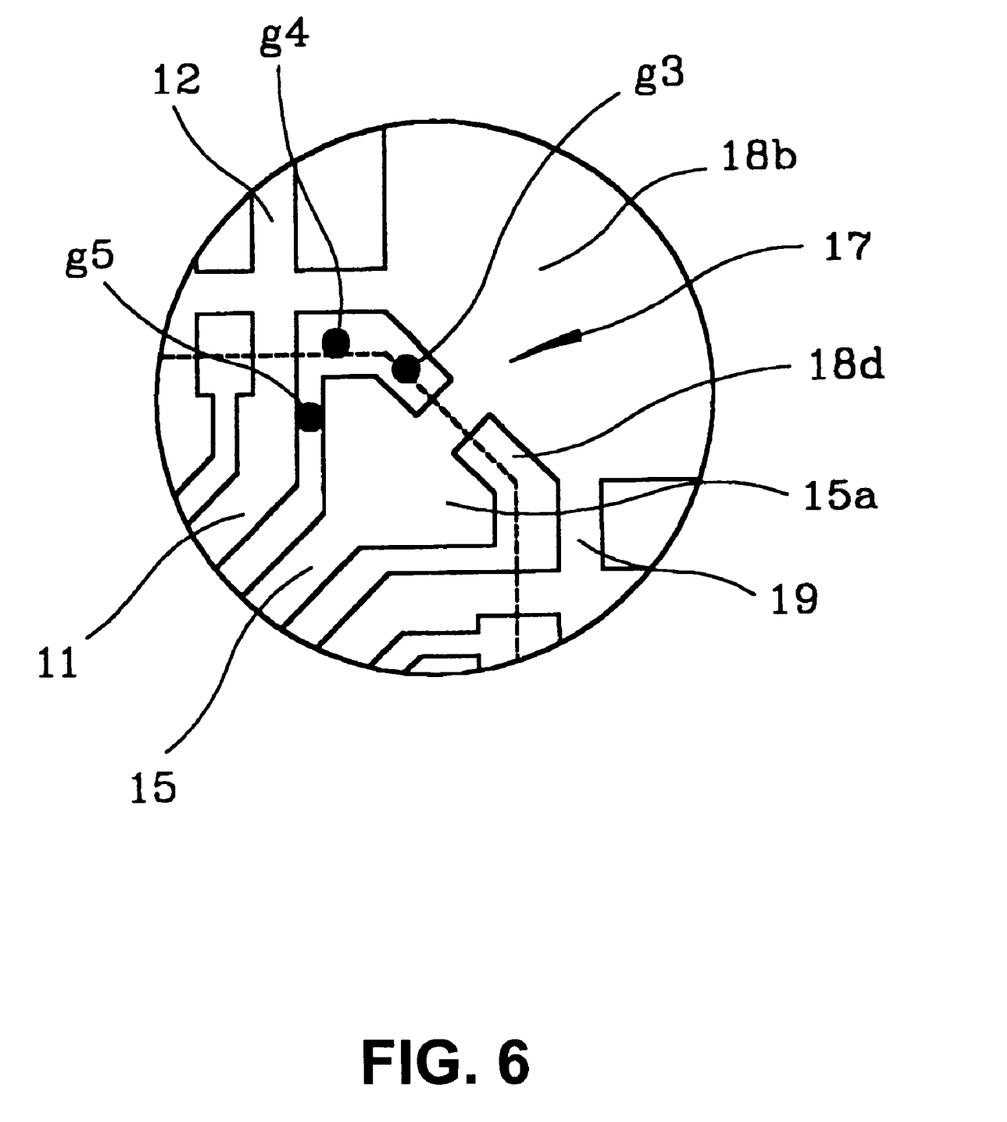
FIG. 6 is an enlarged plan view corresponding to a portion "B" of FIG. 4b.
Figure 7:
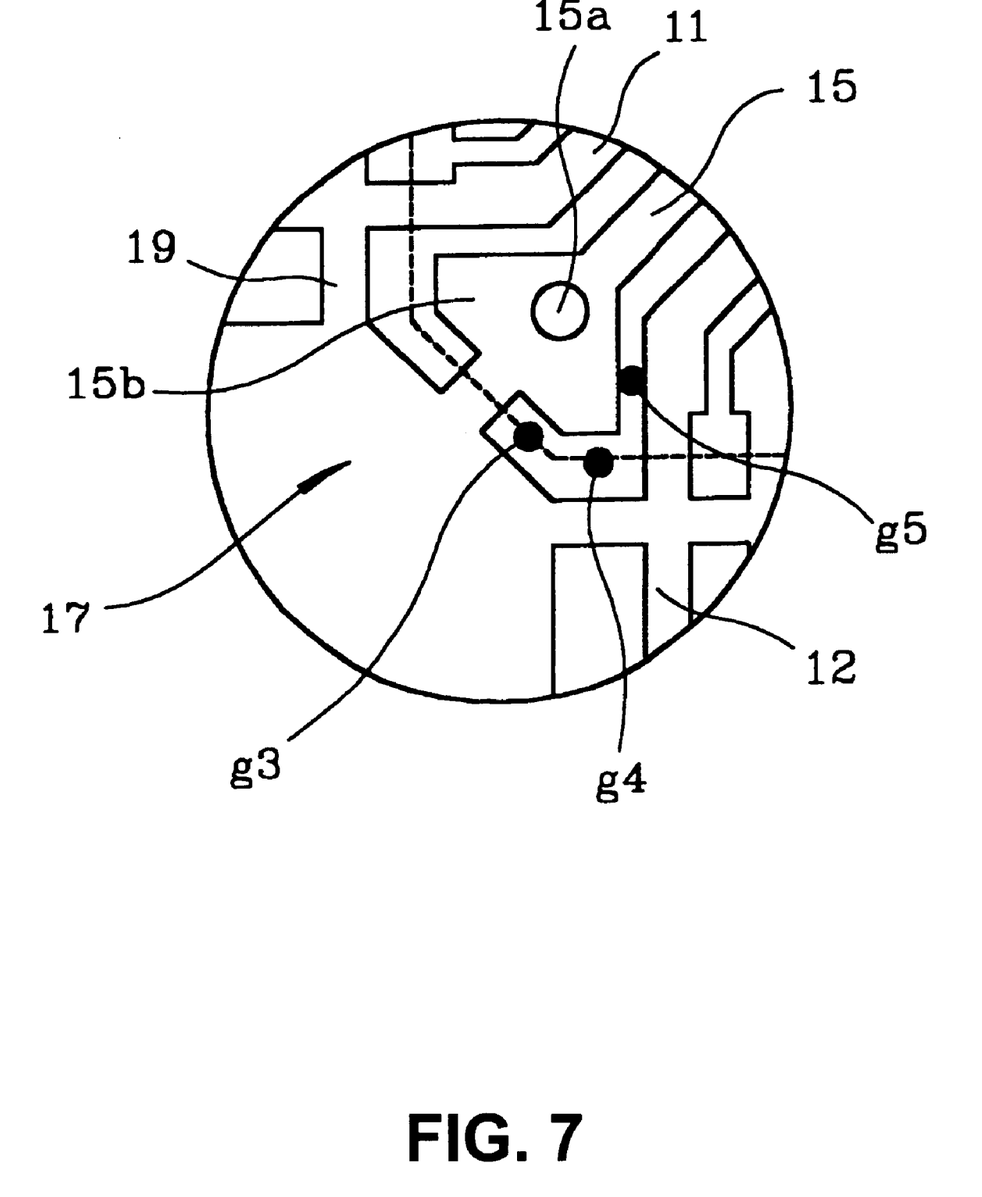
FIG. 7 is an enlarged plan view corresponding to a portion "C" of FIG. 4b.

FIGS. 6 and 7 are enlarged plan views respectively illustrating one of the air vent regions 17 shown in FIG. 4b. For the convenience of description, the following description will be made while simultaneously referring to FIGS. 6 and 7 along with FIGS. 4a and 4b.

At each air vent region 17, one pseudo tie bar 15 and at least one pair of inner leads 11 adjacent to the pseudo tie bar 15 are arranged and extend from a corresponding corner of the lead frame 10 to the central opening 14. Preferably, the pseudo tie bar 15 has a width corresponding to one or two times the width of each inner lead 11. Where the pseudo tie bar 15 has a width more than two times the width of each inner lead 11, it may interfere with a flow of encapsulating resin, thereby causing voids to be undesirably formed in the molded resin encapsulate. On the other hand, where the pseudo tie bar 15 has a width less than the width of each inner lead 11, an insufficient air venting effect is obtained, thereby causing voids to be undesirably formed in the molded resin encapsulate.

The pseudo tie bar 15 arranged at each air vent region 17 is provided with an enlarged portion 15b (FIG. 7) at its outer end (namely, the portion arranged adjacent to the dam bar 19 and the mold runner gate 18b). The enlarged portion 15b of the pseudo tie bar 15 serves as an air vent member for allowing air existing in the mold cavity (denoted by the reference numeral 23 in FIG. 2) to be smoothly vented from the mold cavity during a molding process. A slot 18d extends around the side portions and/or rear portion of the enlarged portion 15b of the pseudo tie bar 15. Practically, the mold is provided with micro ports for air vents at its three corners of its mold cavity except for the corner where the mold runner gate 18b is arranged. Each air vent region 17 of the lead frame 10 is arranged adjacent to an associated one of the corners of the mold cavity where the micro ports for air vents are formed. Accordingly, when melted encapsulating resin flows into the mold cavity where a desired resin encapsulate is to be molded, air existing in the mold cavity is forced to flow toward the three corners of the mold cavity respectively corresponding to the air vent regions 17. The air is then upwardly vented from the mold cavity through the slots 18d without any interference. Although there is a tendency for voids to be easily formed at the corners of the mold cavity, such a tendency is completely prevented by virtue of the volume of the enlarged portion 15b of each pseudo tie bar 15. Since the enlarged portion 15b of each pseudo tie bar 15 also serves as an air vent guide, the air existing in the mold cavity can be easily and effectively vented from the mold cavity.

It is unnecessary to particularly limit the width of each slot 18d. However, it is preferred that each slot 18d has a width g3 of at least 0.2 mm at its portion arranged around the rear edge of the enlarged portion 15b of the corresponding pseudo tie bar 15, a width g5 of at least 0.15 mm at its portion arranged around each side edge of the enlarged portion 15b, and a width g4 of at least 0.2 mm at its portion arranged between portions thereof respectively having the widths g3 and g5. Where each slot 18d has a width limited to those widths g3, g4 and g5 at different portions thereof, respectively, it is possible to more effectively obtain the effects of allowing melted encapsulating resin to easily reach each corner of the resin encapsulating forming region (denoted by the reference numeral 16 in FIG. 4b) while allowing air existing in the mold cavity to be easily vented from the mold cavity.

Meanwhile, at least one information identification hole 15a is centrally formed at the enlarged portion 15b of the pseudo tie bar 15 arranged at a selected one of the air vent regions 17, as shown in FIG. 7. The information identification hole 15a is locked by the molded resin encapsulate, thereby preventing the associated pseudo tie bar 15 from being mis-aligned. The information identification hole 15a is also written with information about the fabrication process applied to the associated lead frame (for example, information about etching or pressing).

Figure 8A:
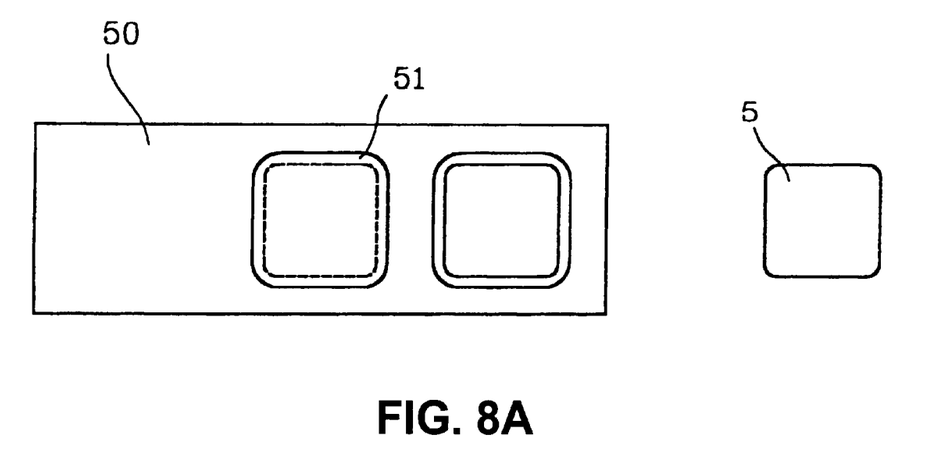
FIG. 8a is a plan view illustrating a procedure for fabricating a heat sink according to the present invention.
Figure 8B:
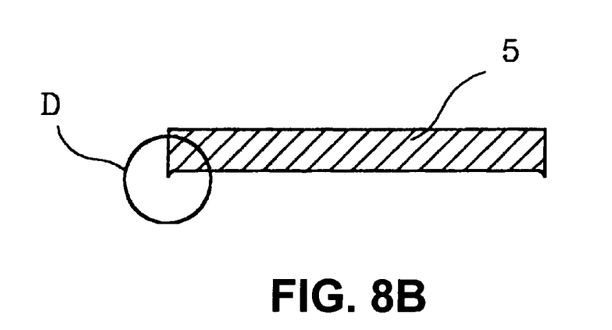
Figure 8C:
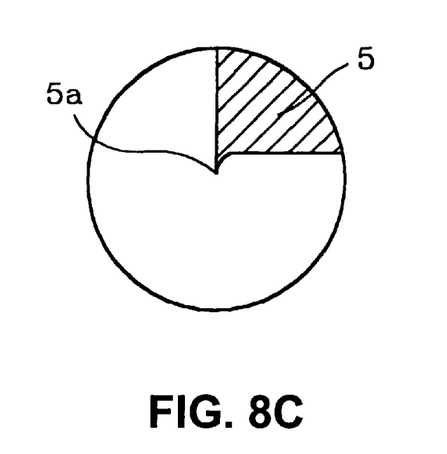
FIG. 8c is an enlarged view corresponding to a portion D of FIG. 8b.

FIG. 8a is a schematic view illustrating a procedure for fabricating the heat sink 5 according to the present invention. FIG. 8b is a side view of the heat sink 5 shown in FIG. 8a. In addition, FIG. 8c is an enlarged view corresponding to a portion D of FIG. 8b. For the convenience of description, the following description will be made while simultaneously referring to FIGS. 8a to 8c.

As shown in FIGS. 8a to 8c, the heat sink 5 is fabricated to have a square shape by forming a slot 51 having a square loop shape through a rectangular metal thin plate strip 50 having a thickness of about 0.3 to 0.7 mm in accordance with a stamping process involving a single stamping step. The reason why the heat sink 5 can be fabricated using a single stamping step is because the metal thin plate strip 50 used has a thickness considerably smaller than the thickness of about 1.65 mm used in conventional cases.

When the heat sink 5 is downwardly punched in accordance with the stamping process, it may be formed with burs 5a extending downwardly from the peripheral edge of its lower surface. Where the heat sink 5 is attached, at its surface carrying the burs 5a, to the lead frame 10, the inner leads of the lead frame 10 may be short-circuited due to the burs 5a. The adhesive layer 6a, which may be a double-sided adhesive tape, may also be undesirably perforated due to the burs 5a. Therefore, it is necessary to attach the heat sink 5, at its surface not carrying the burs 5a, to the lead frame 10.

It is desirable to process the entire surface of the heat sink 5 using a well-known black oxidation process in order to obtain an improved bonding force to the molded resin encapsulate. In accordance with the present invention, the heat sink 5 is completely encapsulated by the resin encapsulate 4 in such a fashion that it has no exposed surface. In this case, accordingly, the heat sink 5 can be used without any problem even in a state in which it is processed only by the black oxidation process without being processed by a complex process involving, for example, a nickel plating process or a sand blasting process.

Figure 9:
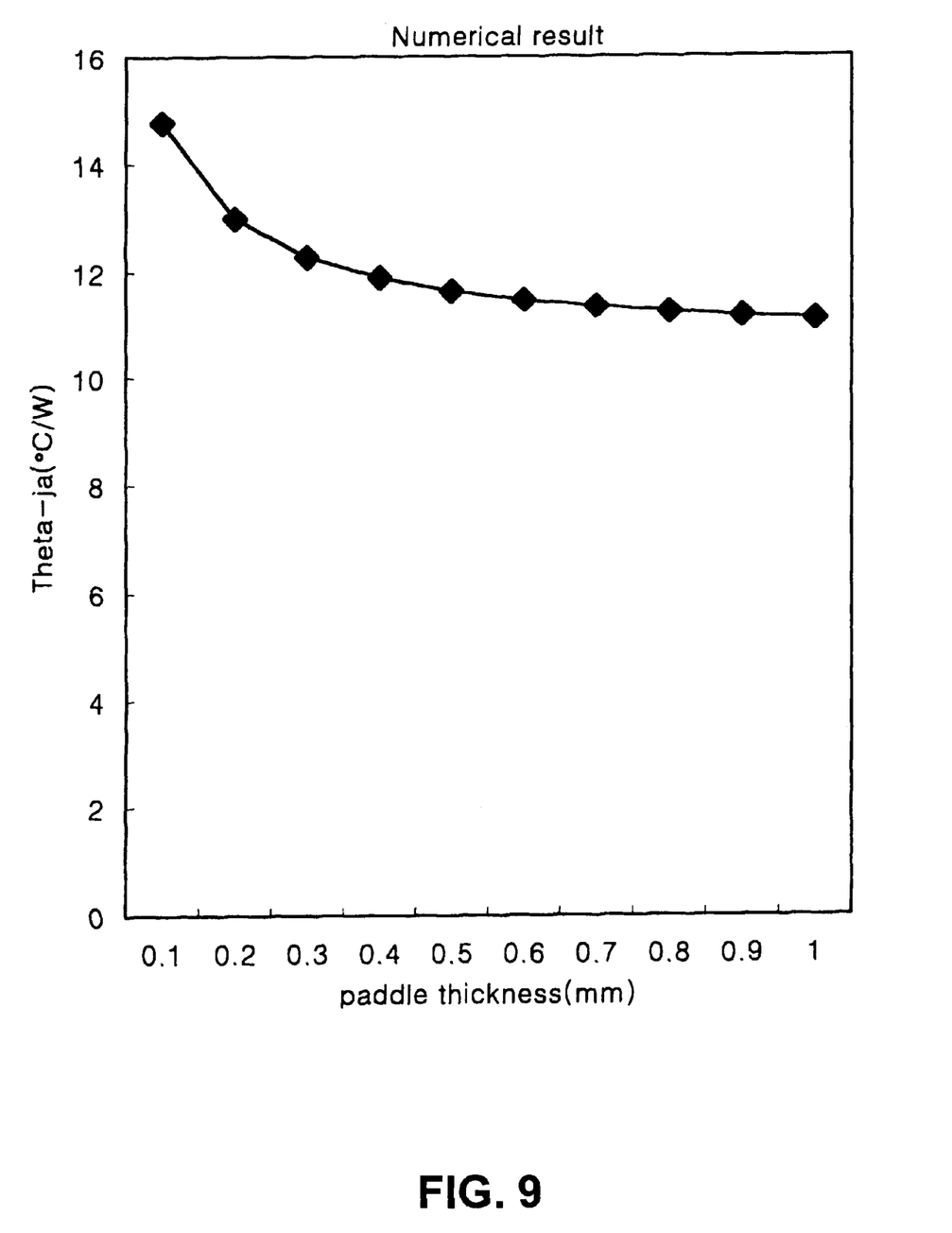
FIG. 9 is a graph depicting a variation in heat discharge effect depending on the thickness of the heat sink.

FIG. 9 is a graph depicting a variation in heat discharge effect depending on the thickness of the heat sink 5. In FIG. 9, the abscissa axis represents the thickness (mm) of the heat sink 5 whereas the ordinate axis represents the value of θJA (° C./W) indicative of thermal resistance.

The graph describes the results of a measurement conducted for quad flat semiconductor packages having a size of 28 mm×28 mm and a number of leads corresponding to 208 while using heat sinks 5 of different thicknesses ranging from 0.1 mm to 1.0 mm.

Referring to FIG. 9, it can be found that a remarkable decrease in the value of θJA (° C./W) is exhibited within a heat sink thickness range from 0.1 mm to 0.3 mm. It is also found that the decrease rate of the value of θJA (° C./W) is low at a heat sink thickness of more than 0.3 mm. That is, no or little variation in the value of θJA (° C./W) is exhibited. A lower value of θJA (° C./W) corresponds to superior heat discharge characteristics.

As a result of a molding experiment conducted in association with the case in which the heat sink 5 is completely encapsulated by a molded resin encapsulate, it was found that there is a tendency for voids to be formed at the central portion of the lower surface of a semiconductor package, finally produced, where the heat sink 5 has a thickness of not less than 1.0 mm. It was also found that where the heat sink 5 has a thickness of not more than 0.2 mm, there is a tendency for voids to be formed at a portion of the lower surface of the semiconductor package (denoted by the reference numeral 1 in FIG. 10) (that is, the lower surface of the resin encapsulate) extending from the edge of the lead frame arranged adjacent to the air vent region 17 opposite to the initial encapsulating resin introduction region 18.

It was also found that when the heat sink 5 has a thickness ranging from 0.30 mm to 0.70 mm, in particular, a thickness of about 0.50 mm, no or little formation of voids occurs.

Figure 10:
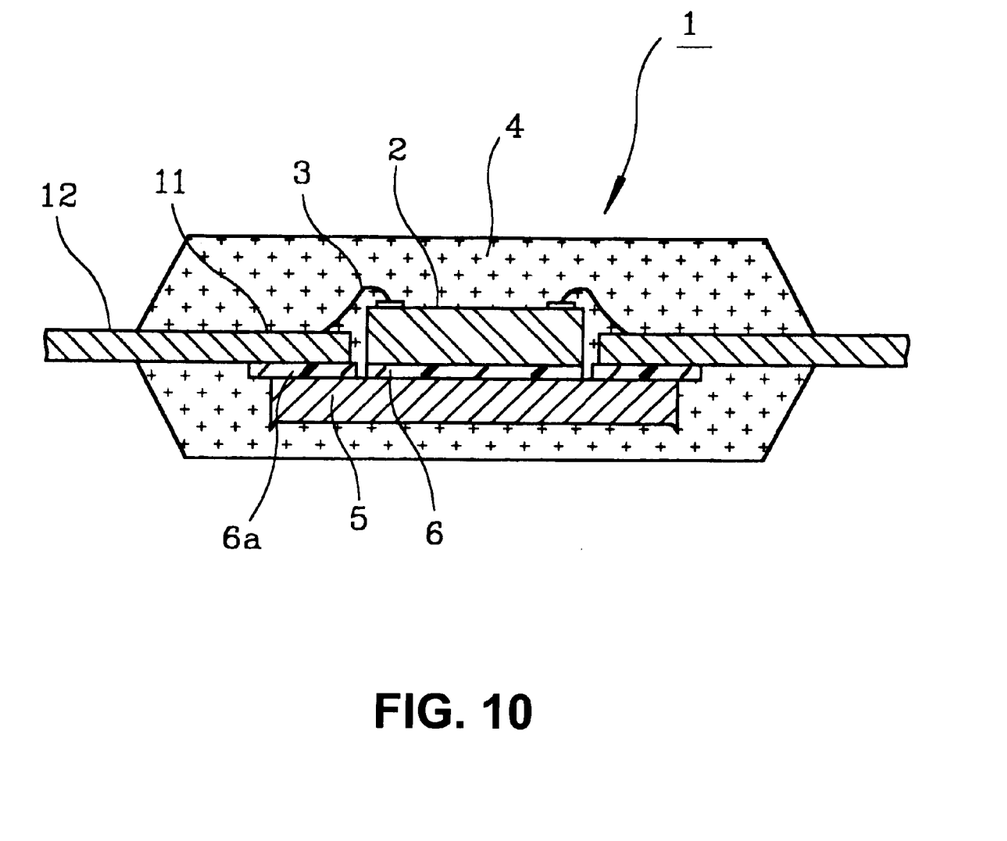
FIG. 10 is a cross-sectional view illustrating a semiconductor package fabricated using the lead frame according to the present invention and the heat sink shown in FIG. 8b.

FIG. 10 is a cross-sectional view illustrating the semiconductor package fabricated using a lead frame having the same structure as the lead frame 10 according to the present invention and a heat sink having the same structure as the heat sink 5 shown in FIG. 8b. In FIG. 10, elements respectively corresponding to those in FIGS. 4a to 8c are denoted by the same reference numerals. As shown in FIG. 10, the semiconductor package, which is denoted by the reference numeral 1, includes a semiconductor chip 2, a heat sink 5 having an upper surface, on which the semiconductor chip 2 is centrally mounted, and a plurality of leads each extending radially and having an inner lead 11 and an outer lead 12. The leads are attached to the outer peripheral portion of the upper surface of the heat sink 5 by means of an adhesive layer 6a comprised of, for example, a double-sided adhesive tape. The semiconductor package 1 also includes a plurality of conductive wires 3 each electrically connecting an inner end of each inner lead 11 to the semiconductor chip 2, and a resin encapsulate 4 for completely encapsulating the semiconductor chip 2, conductive wires 3, and heat sink 5 while encapsulating desired portions of the lead frame 10, that is, the initial encapsulating resin introduction region 18, air vent regions 17, and inner leads 11.

In this semiconductor package 1, the space defined between adjacent ones of the inner leads 11 arranged at the initial encapsulating resin introduction region 18 is larger than the space defined between adjacent ones of the inner leads 11 arranged at regions other than the initial encapsulating resin introduction region 18. The inner leads 11 arranged at the initial encapsulating resin introduction region 18 have a width increasing as they extend from their portions adjacent to the peripheral edge of the resin encapsulate 4 to their portions adjacent to the semiconductor chip 2, respectively. That is, the space defined between adjacent ones of those inner leads 11 has a gradually reduced width as it extends from the peripheral edge of the resin encapsulate 4 to the semiconductor chip 2.

At the initial encapsulating resin introduction region 18, a slot 18a is formed which is defined by two inner leads 11. The slot 18a serves to downwardly guide a flow of melted encapsulating resin in a molding process for molding the resin encapsulate 4 of the semiconductor package 1. An enlarged portion 15c and a slot 18c may be provided at the outer end of the slot 18a. By referring to the description made in conjunction with FIG. 5, details of these configurations can be easily understood.

Also, details of the air vent regions 17 can be easily understood by referring to the description made in conjunction with FIGS. 6 and 7. Accordingly, no further description will be made with regard to the air vent regions 17.

Details of the inner leads 11 associated with the width thereof and the space defined therebetween can be easily understood by referring to the above description. According no further description will be made with regard to the inner leads 11.

As apparent from the above description, the present invention provides a lead frame capable of exhibiting a superior resin filling profile, thereby avoiding formation of voids in a molding process. The present invention also provides a heat sink adapted to be used along with the lead frame to fabricate a semiconductor package. In accordance with the present invention, the heat sink has a structure capable of achieving an easy fabrication thereof, effectively suppressing a bending phenomenon of leads of the lead frame, and minimizing generation of a turbulent flow of melted encapsulating resin in a molding process. Accordingly, the semiconductor package fabricated using the lead frame and heat sink according to the present invention has a resin encapsulate of a superior quality having no void while exhibiting improved heat discharge characteristics. The semiconductor package of the present invention exhibits no or little deformation of their leads. Furthermore, the semiconductor package of the present invention can be easily and simply fabricated.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

We claim:

1. A leadframe comprising:

a metal frame including an open central region within the frame;

a plurality of metal leads extending from a first end integral with the frame to a second end adjacent to the central region, wherein at least a plurality of the leads increase gradually in width from the frame toward the central region.

2. The leadframe of claim 1, wherein all of the leads gradually increase in width from the frame toward the central region.

3. The lead frame of claim 1, wherein the frame has four corners and three metal pseudo tie bars;

wherein two said leads of gradually increasing width are adjacent and extend from opposite sides of a first corner of the frame, said two leads defining an open first slot between them, said slot extending from the first end of the two leads to their respective second ends; and wherein each pseudo tie bar extends diagonally from a first end integral with the second, third, or fourth corner, respectively, of the frame to a second end adjacent to the central region.

4. The leadframe of claim 3, wherein said first slot is between two pair of adjacent said leads of gradually increasing width, wherein the two adjacent leads of each said pair define an open second slot between them, and each of the second slots has width, and the width of the second slots each are less than the width of the first slot.

5. The leadframe of claim 4, wherein the first slot decreases in width from the frame toward the central region.

6. The leadframe of claim 5, further comprising a metal first member integral with the first corner of the frame and extending into the first slot.

7. The leadframe of claim 6, wherein said first member includes edges adjacent to said frame and the two leads that define the first slot, and wherein the edges of the first member, the frame, and the two leads define third slots extending around the first member and intersecting with the first slot.

8. The leadframe of claim 6, wherein said first member has intersecting straight edges that taper to a point aligned with a central axis of the first slot.

9. The leadframe of claim 5, wherein the first slot tapers from a maximum width of 0.7 mm or less to a minimum width of less than 0.35 mm.

10. The leadframe of claim 3, wherein each pseudo tie bar includes a first portion adjacent to a respective corner of the frame and a second portion between the first portion and the central region, wherein the first portion is wider than the second portion and has edges that taper into the second portion.

11. The leadframe of claim 10, wherein the second portion each pseudo tie bar has a minimum width greater than or equal to the width of any of the leads.

12. The leadframe of claim 11, wherein the second portion each pseudo tie bar has a maximum width of two times the width of any of the leads.

13. The leadframe of claim 10, wherein each pseudo tie bar is between two leads, and the first portion of the pseudo tie bar, the frame, and the adjacent leads define open third slots around the first portion of the pseudo tie bar.

14. The leadframe of claim 10, wherein the first portion of one of the three pseudo tie bars has a throughhole.

15. A integrated circuit package comprising:

a package body formed of an encapsulating material;

an integrated circuit chip within said package body;

a plurality of metal leads each having a first portion within the package body and a second portion outside the package body, said first portion extending from an edge of the package body to a first end adjacent to the integrated circuit chip, wherein the integrated circuit chip is electrically connected to the first portion of the leads; and wherein a width of the first portion of at least a plurality of the leads increases gradually from the edge of the package body to the first end.

16. The package of claim 15, wherein the width of the first portion of all of the leads increases gradually in width from the edge of the package body to the first end.

17. The package of claim 15, wherein two intersecting edges of the package body define a first corner of the package body, and two adjacent said leads having the first portion of gradually increasing width each extend inwardly from separate ones of the intersecting edges at said first corner, said two adjacent leads defining a first space between their first portions, said first space extending along a length of the two adjacent leads;

said first space having a width that decreases as the first space extends from the edges toward the first end of the leads; and wherein other adjacent leads of the package define a second space between them, and the width of the first space is greater than the width of any second space.

18. The package of claim 17, further comprising three metal bars each extending diagonally from a corner of the package body other than the first corner to an end adjacent to the integrated circuit, wherein each of said bars has a width greater than a width of any lead.

19. The package of claim 18, further comprising a metal member that extends from near the first corner of the package into the first space.

20. The package of claim 19, wherein each of the metal bars has a first portion near a corner of the package and a second portion between the first portion and the end of the bar, and the first portion of the bar has a greater width than the second portion of the bar.

21. An integrated circuit package comprising:

a package body formed of an encapsulating material;

an integrated circuit chip within said package body;

a plurality of metal leads each having a first portion within the package body and a second portion outside the package body, said first portion extending from an edge of the package body to a first end adjacent to the integrated circuit chip, wherein a width of the first portion of at least a plurality of the leads gradually increases from the edge of the package body to the first end, two intersecting edges of the package body define a first corner of the package body, and two adjacent said leads having the first portion of gradually increasing width each extend inwardly from separate ones of the intersecting edges at said first corner, said two adjacent leads defining a first space between their first portions, said first space extending along a length of the two adjacent leads; and three metal bars each extending diagonally from a respective corner of the package body other than the first corner to a free end adjacent to the integrated circuit.

22. The package of claim 21, wherein the width of the first portion of all of the leads increases gradually in width from the edge of the package body to the first end.

23. The package of claim 21, wherein said first space has a width that decreases as the first space extends from the edges toward the first end of the leads.

24. The package of claim 21, wherein other adjacent pairs of said leads of the package define a second space between them, and the width of the first space is greater than the width of any second space.

25. The package of claim 21, further comprising a plate upon which said integrated circuit chip is mounted, said plate in a non-integral connection with the first end of at least some of said leads and the free end of at least some of said three metal bars.

26. The package of claim 25, wherein the non-integral connection comprises an adhesive layer connection.

* * * * *